(12) United States Patent
Yasuda et al.

(10) Patent No.: US 7,678,446 B2
(45) Date of Patent: Mar. 16, 2010

(54) TRANSPARENT CONDUCTOR AND TRANSPARENT CONDUCTIVE MATERIAL

(75) Inventors: Noriyuki Yasuda, Tokyo (JP); Chieko Yamada, Tokyo (JP)

(73) Assignee: TDK Corporation, Tokyo (JP)

( * ) Notice: Subject to any disclaimer, the term of this patent is extended or adjusted under 35 U.S.C. 154(b) by 574 days.

(21) Appl. No.: 11/476,021

(22) Filed: Jun. 28, 2006

(65) Prior Publication Data

US 2007/0145358 A1   Jun. 28, 2007

(30) Foreign Application Priority Data

Jun. 30, 2005   (JP) ............................ P2005-193124

(51) Int. Cl.
 *B32B 5/16*   (2006.01)
(52) U.S. Cl. ...................................... 428/323
(58) Field of Classification Search ........................ None
See application file for complete search history.

(56) References Cited

U.S. PATENT DOCUMENTS 5,610,305 A * 3/1997 Kvitko et al. .................. 546/6
2006/0222855 A1 * 10/2006 Yasuda .................... 428/411.1

FOREIGN PATENT DOCUMENTS

| JP | A 01-144508 | 6/1989 |
| JP | B2-04-237909 | 8/1992 |
| JP | A-06-308473 | 11/1994 |
| JP | A-7-310033 | 11/1995 |
| JP | A-10-206905 | 8/1998 |
| JP | A-11-170426 | 6/1999 |
| JP | A 2001-064477 | 3/2001 |
| JP | A 2001-076534 | 3/2001 |

\* cited by examiner

*Primary Examiner*—Sheeba Ahmed
(74) *Attorney, Agent, or Firm*—Oliff & Berridge, PLC

(57) ABSTRACT

The transparent conductor of the present invention comprises a conductive layer containing a conductive particle, a binder, a polymerization initiator, and a radical scavenger. In the transparent conductor of the present invention, the conductive layer contains the radical scavenger in addition to the conductive particle. Therefore, even when the conductive particle is pumped upon irradiation with UV rays, so that a radical occurs in the conductive layer, the radical scavenger contained in the conductive layer captures the radical. This restrains the radical from acting on the remaining polymerization initiator and thereby causing a side reaction. As a result, adjacent conductive particles are restrained from fluctuating the distance therebetween.

4 Claims, 2 Drawing Sheets

TRANSPARENT CONDUCTOR AND TRANSPARENT CONDUCTIVE MATERIAL

BACKGROUND OF THE INVENTION

1. Field of the Invention

The present invention relates to a transparent conductor and a transparent conductive material.

2. Related Background Art

Transparent electrodes have been employed in LCD, PDP, organic EL, touch panels, and the like, while transparent conductors have been in use as a transparent electrode. Such a transparent conductor is formed, for example, by printing a UV-curable ink containing conductive particles onto a resin film and then performing a UV-curing process (see Japanese Patent Publication No. 2994767).

However, such a transparent conductor tends to change its electric resistance value when irradiated with UV rays.

Hence, there have been demands for transparent conductors which can restrain the electric resistance value from changing even upon irradiation with UV rays. Proposed as an example of such transparent conductors is a UV-absorbing transparent conductive substrate in which a UV-absorbing layer is interposed between a transparent substrate and a transparent conductive film (see Japanese Patent Application Laid-Open No. HEI 10-206905).

SUMMARY OF THE INVENTION

However, even the UV-absorbing transparent conductor substrate (transparent conductor) containing the UV-absorbing layer disclosed in the above-mentioned Japanese Patent Application Laid-Open No. HEI 10-206905 cannot be considered sufficient for suppressing the change in electric resistance value when irradiated with UV rays.

In view of the foregoing circumstances, it is an object of the present invention to provide a transparent conductor and transparent conductive material which can fully suppress the change in electric resistance value.

The inventors conducted diligent studies in order to solve the problem mentioned above and, as a result, have found that, even when a transparent conductor is provided with a UV-absorbing layer, the UV-absorbing layer cannot completely absorb the UV rays, so that a part of UV rays, those on a longer wavelength side in the UV region in particular, pass through the UV-absorbing layer, thereby entering the transparent conductive film. It has been inferred that these UV rays pump a polymerization initiator in the transparent conductor, so as to generate a radical, which acts on a conductive particle in the transparent conductor, thereby changing the electric resistance value of the transparent conductor. As a result of further diligent studies based on this inference, the inventors have found that the following invention can solve the above-mentioned problem, thereby completing the present invention.

Namely, in one aspect, the present invention provides a transparent conductor comprising a conductive layer containing a conductive particle, a binder, a polymerization initiator, and a radical scavenger. The transparent conductor in the present invention encompasses film- and sheet-like transparent conductors, whereas the film- and sheet-like transparent conductors refer to those having a thickness of 50 nm to 1 mm and a thickness exceeding 1 mm, respectively.

In the transparent conductor of the present invention, the conductive layer contains a radical scavenger in addition to a conductive particle. Therefore, even when the polymerization initiator is pumped upon irradiation with UV rays, so that a radical occurs in the conductive layer, the radical scavenger contained in the conductive layer captures the radical. This restrains the radical from acting on the conductive particle and lowering the electric resistance value of the transparent conductor. Consequently, the transparent conductor of the present invention can suppress the change in electric resistance value.

Preferably, the transparent conductor contains a UV-absorbing agent. In this case, the UV-absorbing agent absorbs UV rays, whereby the amount of UV rays pumping the polymerization initiator decreases.

Preferably, the transparent conductor further comprises a binder layer containing a UV-absorbing agent. When the binder layer contains the UV-absorbing agent, UV rays in the incident light from the binder layer side are absorbed by the UV-absorbing agent. Then, the amount of UV rays reaching the conductive layer further decreases, whereby the amount of radicals occurring in the conductive layer also decreases. Even when a radical occurs in the conductive layer, the radical scavenger reliably captures the radical. Therefore, the transparent conductor can more strongly suppress the change in electric resistance value. Since the amount of radicals generated decreases as mentioned above, the content of the radical scavenger can be reduced as well. Here, "light" refers to a broad concept encompassing visible light, UV rays, and the like.

Preferably, the radical scavenger is represented by the following general formula (1):

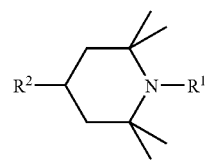

where $R^1$ is a hydrogen atom, an alkyl group which may have a substituent, an alkoxy group which may have a substituent, or an alkylene oxide group which may have a substituent, whereas $R^2$ is a hydrogen atom, an alkyl group which may have a substituent, an alkoxy group which may have a substituent, a carboxyl group, a hydroxyl group, an amine group which may have a substituent, or an alkylene oxide group which may have a substituent.

The radical scavenger represented by the above-mentioned general formula (1) does not decompose itself even when capturing a radical, and thus can effectively capture the radical even in a long-term use. Also, the radical scavenger represented by the above-mentioned general formula (1) is excellent in transparency. When $R^1$ or $R^2$ in the above-mentioned general formula (1) contains an alkyl group in the radical scavenger represented by the above-mentioned general formula (1), the alkalinity of the radical scavenger becomes weaker. This makes it harder for alkalis to decompose the binder and the like contained in the transparent conductor, whereby the transparent conductor can improve its durability.

Preferably, the conductive layer further contains a photosensitizer. When manufacturing the conductive layer by a radical polymerization reaction, the photosensitizer makes radicals less susceptible to oxygen inhibition and allows photoenergy to be efficiently utilized in the radical polymerization reaction, so as to promote a curing reaction of the conductive layer, thereby decreasing remnant monomers and remnant polymerization reaction groups. The polymerization initiator is efficiently decomposed upon UV irradiation at the time of forming the conductive layer. This reduces the amount of polymerization initiator remaining in the conductive layer, whereby UV rays are restrained from acting on the polymerization initiator as mentioned above. Therefore, the transparent conductor can further suppress the change in electric resistance value.

In another aspect, the present invention provides a transparent conductive material containing a monomer for forming a binder, a conductive particle, a polymerization initiator, and a radical scavenger.

The transparent conductive material can yield a transparent conductor which can fully suppress the change in electric resistance value. It also restrains radicals from occurring upon irradiation with UV rays and causing self-condensation and the like when stored for a long period. Namely, the transparent conductive material is excellent in storage stability.

The present invention can provide a transparent conductor and transparent conductive material which can fully suppress the change in electric resistance value.

DESCRIPTION OF THE PREFERRED EMBODIMENTS

Figure 1:
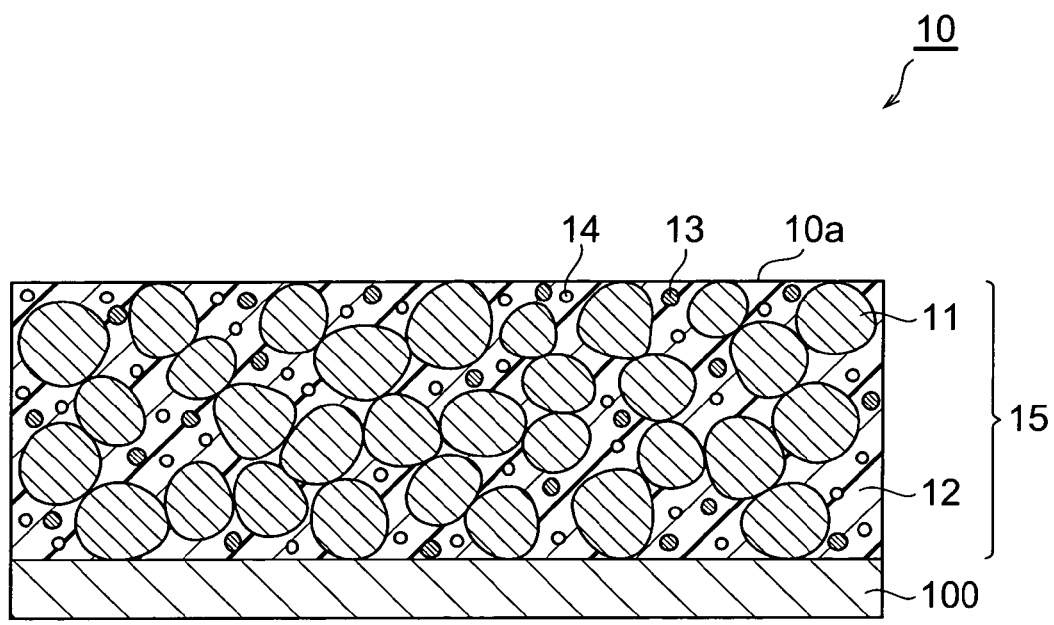
FIG. 1 is a schematic sectional view showing a first embodiment of the transparent conductor in accordance with the present invention.

In the following, preferred embodiments of the present invention will be explained in detail with reference to the drawings as necessary. In the drawings, constituents identical to each other will be referred to with numerals identical to each other without repeating their overlapping descriptions. Ratios of sizes in the drawings are not limited to those depicted.

First Embodiment

To begin with, a first embodiment of the transparent conductor in accordance with the present invention will be explained.

FIG. 1 is a schematic sectional view showing the first embodiment of the transparent conductor in accordance with the present invention. As shown in FIG. 1, the transparent conductor 10 in accordance with this embodiment comprises a conductive layer 15, and a support 100 laminated on the conductive layer 15, whereas the conductive layer 15 contains conductive particles 11, a binder 12, a polymerization initiator 13, and a radical scavenger 14. The conductive layer 15 is filled with the conductive particles 11, whereas the conductive particles 11, polymerization initiator 13, and radical scavenger 14 are dispersed in the binder 12.

Preferably, in the conductive layer 15, the conductive particles 11 are in contact with each other, while a part of the conductive particles 11 are exposed to a surface 10a of the transparent conductor 10. This allows the transparent conductor 10 to have a sufficient conductivity.

In the transparent conductor 10, the conductive layer 15 contains the radical scavenger 14 in addition to the conductive particles 11. Therefore, even when the transparent conductor 10 is exposed to sunlight or light from an indoor fluorescent lamp, so that the polymerization initiator 13 is pumped by UV rays, whereby a radical occurs within the conductive layer 15, the radical scavenger 14 contained in the conductive layer 15 captures the radical. This sufficiently restrains the radical from acting on the conductive particles 11 so as to change the electric resistance value of the transparent conductor and modify the binder 12 in the conductive layer 15, whereby the fluctuation in distance between adjacent conductive particles 11 is fully suppressed. Hence, the transparent conductor 10 can restrain the electric resistance value from changing.

The conductive layer 15 and support 100 in the transparent conductor 10 will now be explained.

Conductive Layer

As mentioned above, the conductive layer 15 contains the conductive particles 11, binder 12, polymerization initiator 13, and radical scavenger 14. In the following, the conductive particles 11, binder 12, polymerization initiator 13, and radical scavenger 14 will be explained in detail.

Conductive Particles

The conductive particles 11 are constructed by a transparent conductive oxide material, for example. The transparent conductive oxide material is not restricted in particular as long as it is transparent and conductive. Examples of the transparent conductive oxide material include indium oxide; indium oxide doped with at least one species of element selected from the group consisting of tin, zinc, tellurium, silver, gallium, zirconium, hafnium, and magnesium; tin oxide; tin oxide doped with at least one species of element selected from the group consisting of antimony, zinc, and fluorine; zinc oxide; and zinc oxide doped with at least one species of element selected from the group consisting of aluminum, gallium, indium, boron, fluorine, and manganese.

Preferably, the conductive particles 11 have an average particle size of 10 nm to 80 nm. The conductivity of the transparent conductor 10 tends to be easier to change with time when the average particle size is less than 10 nm as compared with the case where the average particle size is 10 nm or greater. While conductivity is exhibited by oxygen defects generated in the conductive particles 11 in the transparent conductor 10 in accordance with this embodiment, the oxygen defects may decrease, for example, if the external oxygen concentration is higher when the particle size of the conductive particles is less than 10 nm as compared with the case where the particle size falls within the range mentioned above. When the average particle size exceeds 80 nm, on the other hand, scattering tends to become greater in the wavelength region of visible light than when the average particle size is 80 nm or less, thereby lowering the transmittance of the transparent conductor 10 in the visible light wavelength region and increasing the haze value.

Preferably, the filling ratio of the conductive particles 11 in the conductive layer 15 is 10 vol % to 70 vol %. The electric resistance value of the transparent conductor 10 tends to become higher when the filling ratio is less than 10 vol % as compared with the case where the filling ratio falls within the range mentioned above, whereas the mechanical strength of the conductive layer 15 tends to decrease when the filling ratio exceeds 70 vol % as compared with the case where the filling ratio falls within the range mentioned above.

When the average particle size and filling ratio of the conductive particles 11 thus fall within their respective ranges mentioned above, the transparent conductor 10 can further improve its transparency and lower its initial electric resistance value.

Preferably, the specific surface area of the conductive particles 11 is 10 m$^2$/g to 50 m$^2$/g. The scattering of visible light tends to become greater when the specific surface area is less than 10 m²/g as compared with the case where the specific surface area falls within the range mentioned above, whereas the stability of the transparent conductor 10 tends to deteriorate when the specific surface area exceeds 50 m²/g as compared with the case where the specific surface area falls within the range mentioned above. Here, the specific surface area refers to a value measured by a specific surface area measuring apparatus (type: NOVA2000 manufactured by Quantachrome Instruments) after drying a sample in vacuum for 30 minutes at 300° C.

Binder

The binder 12 is not restricted in particular as long as it can secure the conductive particles 11. Examples of the binder 12 include acrylic resins, epoxy resins, polystyrene, polyurethane, silicone resins, and fluorine resins.

Among them, acrylic resins are preferably used as the binder 12. They can improve the transmittance of the transparent conductor 10 more than the other binders do. Namely, the transparent conductor 10 containing an acrylic resin as the binder 12 can improve the transparency more. Acrylic resins are also excellent in chemical resistance to acids and alkalis and resistance to scratch (surface hardness). Therefore, the transparent conductor 10 containing an acrylic resin in the conductive layer 15 is favorably used in touch panels and the like which are expected to be wiped with a cleaner containing an organic solvent, a surfactant, and the like, or have surfaces of the conductive layer which may come into contact with each other, rub against each other, and so forth.

The binder 12 is manufactured by polymerizing a radically polymerizable compound, an ionically polymerizable compound, or a thermally polymerizable compound. The radically polymerizable compound refers to an organic compound which is polymerized by a radical. The ionically polymerizable compound refers to an organic compound which is polymerized by a cation. The thermally polymerizable compound refers to an organic compound which is polymerized by heat. These organic compounds contain a substance to become a raw material for the binder 12. Specifically, they contain monomers, dimers, trimers, oligomers, and the like which can form the binder 12.

Among them, monomers of a radically polymerizable compound or monomers of an ionically polymerizable compound are used preferably. This is advantageous in that the process management becomes easier, since the polymerization reaction can be controlled, while polymerization can be achieved in a short time. More preferably, monomers of a radically polymerizable compound are used. This is advantageous in that the reproducibility in film thickness and the dimensional precision are easier to attain than in the case of ionic polymerization, since the monomers of the radically polymerizable compound are polymerized together instantaneously upon irradiation with light. It will be sufficient if such monomers of the radically polymerizable compounds contain a vinyl group or its derivatives. Their specific examples include acrylic acid and its derivatives, methacrylic acid and its derivatives, and styrene and its derivatives. They may be used singly or in mixtures of two or more species.

Polymerization Initiator

The polymerization initiator 13 contained in the conductive layer 15 may be anything which can start polymerizing the binder 12. The polymerization initiator 13 is usually the part remaining in the conductive layer 15 without contributing to the polymerization reaction because of the deactivation of a radical by oxygen dissolved in the binder or a filler or filter effect preventing the UV rays from irradiating the conductive layer 15 in the polymerization initiator 13 employed when polymerizing the monomers of the binder 12. Examples of the polymerization initiator 13 include radical polymerization initiators, cationic polymerization initiators, and thermal polymerization initiators. In this embodiment, as mentioned above, the radical polymerization initiator, cationic polymerization initiator, and thermal polymerization initiator are used when manufacturing the binder 12 by polymerizing the radically polymerizable compound, ionically polymerizable compound, and thermally polymerizable compound, respectively.

Specific examples of the radical polymerization initiators include 2,2-dimethoxy-1,2-diphenylethane-1-one, 1-hydroxycyclohexylphenylketone, 2-hydroxy-2-methyl-1-phenylpropane-1-one, bis(2,4,6-trimethylbenzoyl)phenylphosphinoxide, 1-[4-(benzoylphenylsulfanyl)phenyl]-2-methyl-2-(4-methylphenylsulfonyl)propane-1-one, and oligo[2-hydroxy-2-methyl-1-[4-(1-methylvinyl)phenyl]propanone]. Specific examples of the cationic polymerization initiators include monoallylsulfonium heaxafluorophosphate salts, diallylsulfonium hexafluorophosphate salts, di(p-tert-butylphenyl)iodonium hexafluorophosphate, and η5-cyclopentadienyl-η6-cumenyliron hexafluorophosphate. Specific examples of the thermal polymerization initiators include benzoyl peroxide and 2,2-azobisisobutylonitrile. Since the radically polymerizable compound is preferably used as mentioned above, a radical polymerization initiator is preferably used as the polymerization initiator 13.

The content of the polymerization initiator 13 is preferably 0.2 to 2.0 mass % when the total mass of the conductive layer 15 is 100 mass %. When the content is less than 0.2 mass %, curing becomes insufficient, whereby strength tends to decrease as compared with the case where the content falls within the range mentioned above. When the content exceeds 2.0 mass %, a greater amount of the polymerization initiator 13 remains in the conductive layer 15, whereby radicals are more likely to occur in the conductive layer 15 as compared with the case where the content falls within the range mentioned above. Then, radicals tend to act on the conductive particles in the transparent conductor, whereby the electric resistance value of the transparent conductor 10 is easier to change.

Radical Scavenger

The radical scavenger 14 may be anything as long as it can capture a radical. Preferably, the radical scavenger 14 is one which does not decompose itself even when capturing a radical. This allows the radical scavenger 14 to capture the radical effectively even in a long-term use. Examples of such a radical scavenger 14 include hindered-amine-based compounds. Preferred among them is one represented by the following general formula (1):

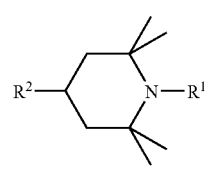

(1)

where $R^1$ is a hydrogen atom, an alkyl group which may have a substituent, an alkoxy group which may have a substituent, or an alkylene oxide group which may have a substituent, whereas $R^2$ is a hydrogen atom, an alkyl group which may have a substituent, an alkoxy group which may have a substituent, a carboxyl group, a hydroxyl group, an amine group which may have a substituent, or an alkylene oxide group which may have a substituent.

The radical scavenger represented by the above-mentioned general formula (1) does not decompose itself even when capturing a radical, and thus can effectively capture the radical even in a long-term use. Also, the radical scavenger represented by the above-mentioned general formula (1) is excellent in transparency. Further, the radical scavenger represented by the above-mentioned general formula (1) does not hamper polymerization reactions.

Preferably, in the radical scavenger 14 represented by the above-mentioned general formula (1), $R^1$ is an alkyl group which may have a substituent, an alkoxy group which may have a substituent, or an alkylene oxide group which may have a substituent, whereas $R^2$ is an alkyl group which may have a substituent, an alkoxy group which may have a substituent, or an alkylene oxide group which may have a substituent. Since $R^1$ or $R^2$ in the above-mentioned general formula (1) contains an alkyl group, the alkalinity of the radical scavenger 14 becomes weaker in this case. This makes it harder for alkalis to decompose the binder 12 and the like contained in the transparent conductor 10, whereby the transparent conductor 10 can improve its durability.

Examples of the alkyl group which may have a substituent include methyl, ethyl, octyl, decyl, and dodecyl groups, among which alkyl groups having a carbon number of 8 or greater are preferred, and octyl, decyl, and dodecyl groups are more preferred. This can further weaken the alkalinity and restrain the radical scavenger from bleeding. Examples of the alkoxy group which may have a substituent include methoxy, ethoxy, octyloxy, decyloxy, and dodecyloxy groups, among which alkoxy groups having a carbon number of 8 or greater are preferred, and octyloxy, decyloxy, and dodecyloxy groups are more preferred. This can further weaken the alkalinity and restrain the radical scavenger from bleeding. Examples of the alkylene oxide group which may have a substituent include methylene oxide, ethylene oxide, and propylene oxide groups, which may be either single polymers or copolymers. Usable as the alkylene oxide group are those having a repeating unit n of 2 to 10. This can further weaken the alkalinity and restrain the radical scavenger from bleeding.

Specific examples of the radical scavenger 14 include [dimethyl succinate-1-(2-hydroxyethyl)-4-hydroxy-2,2,6,6-tetramethylpiperidine]condensate, 1,2,2,6,6-pentamethyl-4-piperidyltridecyl-1,2,3,4-butane tetracarboxylate, decanedioic acid bis(2,2,6,6-tetramethyl-1-(octyloxy)-4-piperidinyl) ester derivatives, and bis(2,2,6,6-tetramethyl-4-piperidinyl) sebacate. Preferred among them are decanedioic acid bis(2,2,6,6-tetramethyl-1-(octyloxy)-4-piperidinyl) ester derivatives. This allows the radical scavenger 14 to have a lower alkalinity.

Preferably, the content of the radical scavenger 14 is 0.1 to 1.0 mass % when the total mass of the conductive layer 15 is 100 mass %. When the content is less than 0.1 mass %, radicals are less likely to be captured sufficiently as compared with the case where the content falls within the range mentioned above. When the content exceeds 1.0 mass %, the effect in proportion to the amount of addition is less likely to attain as compared with the case where the content falls within the range mentioned above. Namely, the effect tends to be unchangeable even when the amount of addition increases.

Support

In the transparent conductor 10 in accordance with this embodiment, the support 100 is not an essential layer but may be provided as appropriate according to the purpose of the transparent conductor 10 and the like.

The support 100 is not restricted in particular as long as it is constructed by a material transparent to visible light. Namely, the support 100 may be a known transparent film, examples of which include films of polyesters such as polyethylene terephthalate (PET), films of polyolefins such as polyethylene and polypropylene, polycarbonate films, acrylic films, and norbomene films (e.g., ARTON manufactured by JSR Corporation). Not only the resin films, but glass may also be used as the support 14. Preferably, the support 100 is made of a resin alone. This makes the transparent conductor 10 excellent in transparency and bendability. Therefore, the transparent conductor 10 is effective in particular for use in touch panels, for example.

Manufacturing Method

A method of manufacturing the transparent conductor 10 in accordance with this embodiment in the case using tin-doped indium oxide (hereinafter referred to as "ITO") as the above-mentioned conductive particles 11 will now be explained.

First, indium chloride and tin chloride are coprecipitated by neutralization with an alkali (precipitating step). Here, the salt yielded as a byproduct is eliminated by decantation or centrifugation. Thus obtained coprecipitate is dried, and the resulting dried product is fired in an atmosphere and pulverized. This manufactures conductive particles. It will be preferred from the viewpoint of controlling oxygen defects if the firing is performed in a nitrogen atmosphere or in an atmosphere of a rare gas such as helium, argon, or xenon.

The monomer for forming the binder, the polymerization initiator 13, and the radical scavenger 14 are added to thus obtained conductive particles 11, and they are dispersed in a liquid, so as to yield a transparent conductive material. If necessary, additives such as photosensitizer and UV-absorbing agent may be added to this dispersion liquid. Examples of the liquid for dispersing the conductive particles 11, binder 12, polymerization initiator 13, and radical scavenger 14 include saturated hydrocarbons such as hexane; aromatic hydrocarbons such as toluene and xylene; alcohols such as methanol, ethanol, propanol, and butanol; ketones such as acetone, methylethylketone, isobutylmethylketone, and diisobutylketone; esters such as ethyl acetate and butyl acetate; ethers such as tetrahydrofuran, dioxane, and diethyl ether; and amides such as N,N-dimethylacetamide, N,N-dimethylformamide, and N-methylpyrrolidone. The binder or monomer may be used as being dissolved in the liquid.

Since the transparent conductive material contains the radical scavenger 14, a radical occurring upon irradiation with UV rays, if any, can be restrained from causing self-condensation and the like in a long-term use. Namely, the transparent conductive material is excellent in storage stability with time. The transparent conductor shaped from the transparent conductive material contains the radical scavenger 14 as mentioned above and thus can sufficiently keep the electric resistance value from changing.

Subsequently, thus obtained transparent conductive material is applied onto the support 100. The support 100 may be provided beforehand with an anchor layer on the surface to be formed with the conductive layer 15. The anchor layer provided beforehand on the support 100 allows the conductive layer 15 to be fixed more firmly onto the support 100 through the anchor layer. Polyurethane and the like are favorably used as the anchor layer.

Preferably, after applying the transparent conductive material, a drying process is performed, so as to yield an unpolymerized conductive layer. Examples of the coating method include reverse rolling, direct rolling, blading, knifing, extrusion, nozzle method, curtaining, gravure rolling, bar coating, dipping, kiss coating, spin coating, squeezing, and spraying.

Then, the unpolymerized conductive layer provided on the support 100 is polymerized. When the unpolymerized conductive layer contains a radically polymerizable component, this component is polymerized upon irradiation with high-energy lines, whereby the conductive layer 15 is formed. When the unpolymerized conductive layer contains an ionically polymerizable component, this component is polymerized by adding a cationic polymerization initiator thereto, whereby the conductive layer 15 is formed. When the unpolymerized conductive layer contains a thermally polymerizable component, this component is polymerized by heating, whereby the conductive layer 15 is formed. The above-mentioned high-energy lines may be not only UV rays, but also electron beams, γ-rays, x-rays, and the like as long as they can generate a radical.

When the polymerization is a radical polymerization, irradiation with high-energy lines causes the radical polymerization initiator to generate a radical, whereby the radical polymerization proceeds. Consequently, the radical scavenger contained in the unpolymerized conductive layer captures the radical. Even in this case, however, a longer time of irradiation with the high-energy lines can reliably form the conductive layer 15.

Thus, the conductive layer 15 is formed on one surface of the support 100, whereby the transparent conductor 10 shown in FIG. 1 is obtained. This transparent conductor 10 can be used in panel switches such as touch panels and light-transmitting switches, and is also favorably usable in antinoise components, heating elements, electrodes for EL, electrodes for backlight, LCD, PDP, and the like.

Additives

The above-mentioned additives will now be explained. The additives are not essential components, but may be contained in the transparent conductor 10 as appropriate according to its purpose and the like.

Photosensitizer

The transparent conductor 10 in accordance with this embodiment preferably contains a photosensitizer, in the conductive layer 15 in particular. When manufacturing the conductive layer 15 by a radical polymerization reaction, the photosensitizer makes radicals less susceptible to oxygen inhibition and allows photoenergy to be efficiently utilized in the radical polymerization reaction, so as to accelerate the curing reaction of the conductive layer 15, whereby the remaining monomer and remaining polymerization reaction group can be decreased. Also, the polymerization initiator 13 is efficiently decomposed upon irradiation with UW rays at the time of forming the conductive layer 15. This reduces the amount of polymerization initiator 13 remaining in the conductive layer 15, whereby the UW rays are restrained from acting on the polymerization initiator 13 as mentioned above. Therefore, the transparent conductor 10 can further keep its electric resistance value from changing.

Preferably, the photosensitizer is any of amine-based sensitizers, benzophenone derivatives, and thioxanthone derivatives. When the photosensitizer is any of these compounds, it also absorbs UW rays and thus can more strongly keep radicals from occurring in the conductive layer 15.

The content of the photosensitizer is preferably 0.2 to 2.0 mass % when the total mass of the conductive layer 15 is 100 mass %. When the content is less than 0.2 mass %, the polymerization initiator can be decomposed less than in the case where the content falls within the range mentioned above, so that the curing becomes insufficient, whereby the strength tends to decrease. The content exceeding 2.0 mass % may cause coloring and odor more than in the case where the content falls within the range mentioned above.

UV-Absorbing Agent

Preferably, the transparent conductor 10 in accordance with this embodiment contains a UV-absorbing agent. In this case, the UV-absorbing agent absorbs UV rays, whereby the amount of UV rays pumping the polymerization initiator 13 contained in the transparent conductor 10 is reduced.

The UV-absorbing agent may be contained either in the conductive layer 15 or in the support 100. Examples of the UV-absorbing agent include inorganic substances such as titanium oxide, zinc oxide, iron oxide, aluminum oxide, cerium oxide, zirconium oxide, mica, kaolin, and sericite. This can make the transparent conductor 10 excellent in moisture resistance. The UV-absorbing agent itself may be any of these inorganic substances.

Other examples of the UV-absorbing agent include organic substances such as compounds having an azo group within a molecule, compounds having a triazine ring, benzotriazole, benzophenone, benzoylmethane, hydroxybenzoate, and their derivatives. More preferred among them are triazine ring derivatives and benzotriazole derivatives. They are advantageous in that they are excellent in visible light transmittance. They may be used either singly or in mixtures of two or more species of inorganic and organic substances, inorganic substances, or organic substances.

Many of the UV-absorbing agents including these functional groups and derivatives have an absorption wavelength of 380 nm or shorter, and thus can sufficiently secure the transparency of the transparent conductor 10.

Among them, the UV-absorbing agents having a triazine ring or benzotriazole in a molecule are advantageous in that they absorb only UV rays without affecting the transparency for the visible light region.

Since benzotriazole has a broad wavelength region for UV rays, the UV-absorbing agent having benzotriazole in a molecule can fully restrain UV rays from affecting the conductive particles 11 contained in the transparent conductor 10 in particular.

Preferably, the content of the UV-absorbing agent in the conductive layer 15 is 0.1 mass % to 5.0 mass % when the total mass of the conductive layer 15 is 100 mass %. When the content is less than 0.1 mass %, UV rays are absorbed less than in the case where the content falls within the range mentioned above, whereby there is a tendency that the conductive particles 11 may be affected by the UV rays. When the content exceeds 5.0 mass %, the strength by which the binder 12 secures the conductive particles 11 becomes lower than that in the case where the content falls within the range mentioned above, whereby there is a tendency that the mechanical strength of the transparent conductor 10 may not be sufficiently obtained.

Other Additives

The transparent conductor 10 may further contain other additives as necessary. Examples of the other additives include crosslinking agents, surface-treating agents, flame retardants, colorants, and plasticizers.

Second Embodiment

A second embodiment of the transparent conductor in accordance with the present invention will now be explained.

Figure 2:
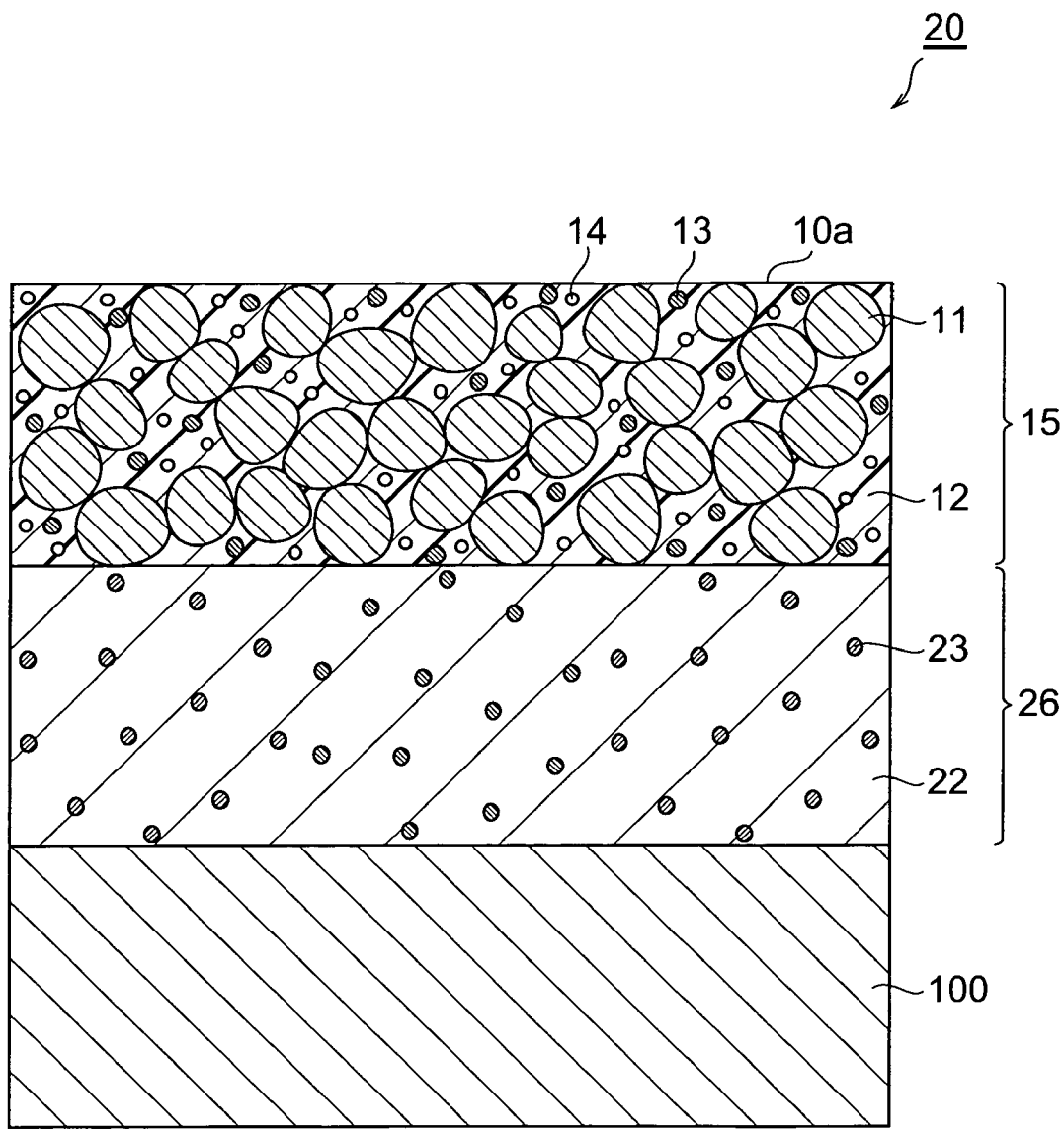
FIG. 2 is a schematic sectional view showing a second embodiment of the transparent conductor in accordance with the present invention.

FIG. 2 is a schematic sectional view showing the second embodiment of the transparent conductor in accordance with the present invention. As shown in FIG. 2, the transparent conductor 20 of this embodiment differs from the transparent conductor 10 of the first embodiment in that it further comprises a binder layer 26 containing a UV-absorbing agent 23 between the conductive layer 15 and the support 100.

Since the transparent conductor 20 further comprises the binder layer 26 containing the UV-absorbing agent 23, the UV-absorbing agent 23 absorbs the UV region from incident light from the side of binder layer 26 opposite from the conductive layer 15 (i.e., from the support 100 side). This reduces the amount of UV rays reaching the conductive layer 15, thereby decreasing the amount of radicals occurring in the conductive layer 15. Even if a radical occurs, the radical scavenger 14 will reliably capture the radical. Therefore, the transparent conductor 20 can more strongly restrain the electric resistance value from changing. This can also reduce the amount of addition of the radical scavenger 14.

The binder layer 26 of the transparent conductor 20 will now be explained.

Binder Layer

The binder layer 26 contains the UV-absorbing agent 23. The UV-absorbing agent 23 used here is the same as that explained in the first embodiment. When both of the conductive layer 15 and binder layer 26 contain UV-absorbing agents, the UV-absorbing agent contained in the conductive layer 15 may be either identical to or different from the UV-absorbing agent contained in the binder layer 26.

Preferably, the content of the UV-absorbing agent 23 in the binder layer 26 is 0.1 mass % to 5.0 mass % when the total mass of the binder layer 26 is 100 mass %. When the content is less than 0.1 mass %, UV rays can be absorbed less than in the case where the content falls within the range mentioned above, whereby the binder tends to deteriorate. When the content exceeds 5.0 mass %, the bonding strength between the binder layer 26 and the conductive layer 15 or support 100 tends to become lower than in the case where the content falls within the range mentioned above.

Preferably, the binder layer 26 further comprises a binder 22. In this case, the UV-absorbing agent 23 can be secured by the binder 22. The binder 22 used here is the same as the binder 12 explained in the first embodiment. The binder 12 contained in the conductive layer 15 may be either identical to or different from the binder 22 contained in the binder layer 26.

In this embodiment, the binder layer 26 may contain additives such as the above-mentioned polymerization initiators, amine-based sensitizers, crosslinking agents, surface-treating agents, flame retardants, colorants, and plasticizers.

Manufacturing Method

A method of manufacturing the transparent conductor 20 in accordance with this embodiment in the case using tin-doped indium oxide (hereinafter referred to as "ITO") as the above-mentioned conductive particles 11 will now be explained.

First, the UV-absorbing agent 23 is added to the binder 22, for example, and they are dispersed into a liquid, so as to yield a dispersion liquid. In place of the binder 22, its monomer, dimer, and the like may also be used. The above-mentioned additives may be added to the dispersion liquid as necessary. Examples of the liquid for dispersing the UV-absorbing agent 23 and binder 12 include saturated hydrocarbons such as hexane; aromatic hydrocarbons such as toluene and xylene; alcohols such as methanol, ethanol, propanol, and butanol; ketones such as acetone, methylethylketone, isobutylmethylketone, and diisobutylketone; esters such as ethyl acetate and butyl acetate; ethers such as tetrahydrofuran, dioxane, and diethyl ether; and amides such as N,N-dimethylacetamide, N,N-dimethylformamide, and N-methylpyrrolidone. Here, the binder or monomer may be dissolved instead of being dispersed in the liquid.

Thus obtained dispersion liquid is applied onto the support 100. The support 100 may be provided beforehand with an anchor layer on the surface side to be formed with the conductive layer 15. The anchor layer provided beforehand on the support 100 allows the binder layer 26 to be fixed more firmly onto the support 100 through the anchor layer. Polyurethane and the like are favorably used as the anchor layer.

Preferably, after applying the dispersion liquid, a drying process is performed, so as to yield an unpolymerized binder layer. Examples of the coating method include reverse rolling, direct rolling, blading, knifing, extrusion, nozzle method, curtaining, gravure rolling, bar coating, dipping, kiss coating, spin coating, squeezing, and spraying.

Then, the unpolymerized binder layer provided on the support 100 is polymerized. When the unpolymerized binder layer contains a thermally polymerizable component, this component is polymerized by heating, whereby the binder layer 26 is formed. When the unpolymerized binder layer contains a radically polymerizable component, this component is polymerized upon irradiation with high-energy lines, whereby the binder layer 26 is formed. When the unpolymerized conductive layer contains an ionically polymerizable component, this component is polymerized by adding a cationic polymerization initiator thereto, whereby the binder layer 26 is formed. The high-energy lines may be not only UV rays, but also electron beams, γ-rays, x-rays, and the like as long as they can generate a radical.

When forming the binder layer 26 containing the UV-absorbing agent 23 by using a radical polymerization initiator, the radical polymerization initiator is preferably one which can generate a radical in a visible light region. Its specific examples include bis(2,4,6-trimethylbenzoyl)phenylphosphine oxide, bis(η5-2,4-cyclopentadiene-1-yl)bis(2,6-difluoro-3-(1H-pyrrole-1-yl)phenyl)titanium, 2-benzyl-2-dimethylamino-1-(4-morpholinophenyl)butanone-1-one, 2-methyl-1-[4-(methylthio)phenyl]-2-morpholinopropane-1-one, and 2,4,6-trimethylbenzoyldiphenylphosphine oxide. A radical polymerization initiator usually starts a radical polymerization by absorbing a predetermined wavelength in a UV region. When the UV-absorbing agent exists as mentioned above, the radical polymerization initiator is not sufficiently irradiated with UV rays, whereby the radical polymerization is hard to start. This makes it necessary for the radical polymerization to start in a region where wavelengths absorbed by the UV-absorbing agent 23 do not overlap wavelengths absorbed by the radical polymerization initiator. However, the above-mentioned radical polymerization initiator can generate a radical in the visible light region as well. Namely, the wavelength range of light which can start the radical polymerization covers not only the near-UV region but also the visible ray region shifted from the near-UV rays. Therefore, even when the UV-absorbing agent 23 exhibiting a wide absorption in the UV region is used, the radical polymerization initiator is irradiated with visible light which can radically polymerize the radical polymerization initiator, whereby the radical polymerization can reliably be started.

Thus, the binder layer 26 is formed on one surface of the support 100.

Subsequently, the above-mentioned transparent conductive material is applied onto the binder layer 26 provided on the support 100. Preferably, after applying the transparent conductive material, a drying process is performed, so as to yield an unpolymerized conductive layer. Examples of the coating method include reverse rolling, direct rolling, blading, knifing, extrusion, nozzle method, curtaining, gravure rolling, bar coating, dipping, kiss coating, spin coating, squeezing, and spraying.

Then, the unpolymerized conductive layer provided on the binder layer 26 is polymerized. When the unpolymerized conductive layer contains a radically polymerizable component, this component is polymerized upon irradiation with high-energy lines, whereby the conductive layer 15 is formed. When the unpolymerized conductive layer contains an ionically polymerizable component, this component is polymerized by adding a cationic polymerization initiator thereto, whereby the conductive layer 15 is formed. When the unpolymerized conductive layer contains a thermally polymerizable component, this component is polymerized by heating, whereby the conductive layer 15 is formed. The high-energy lines may be not only UV rays, but also electron beams, γ-rays, x-rays, and the like as long as they can generate a radical.

Thus, the conductive layer 15 is formed on one surface of the binder 26, whereby the transparent conductor 20 shown in FIG. 2 is obtained. This transparent conductor 20 can be used in panel switches such as touch panels and light-transmitting switches, and is also favorably usable in antinoise components, heating elements, electrodes for EL, electrodes for backlight, LCD, PDP, and the like.

EXAMPLES

The present invention will be explained more specifically with reference to examples in the following, though the present invention is not limited to these examples.

Making of Conductive Particles

An aqueous solution dissolving 19.9 g of indium chloride tetrahydrate (manufactured by Kanto Chemical Co., Inc.) and 2.6 g of stannic chloride (manufactured by Kanto Chemical Co., Inc.) into 980 g of water and a 10-fold water dilution of aqueous ammonia (manufactured by Kanto Chemical Co., Inc.) were mixed while being prepared, so as to produce a white precipitate (coprecipitate).

The liquid containing thus produced precipitate was subjected to solid-liquid separation by a centrifuge, so as to yield a solid. The solid was put into 1,000 g of water, dispersed by a homogenizer, and then subjected to solid-liquid separation by the centrifuge. After performing five sets of dispersion and solid-liquid separation, the solid was dried, and then was heated for 1 hour at 600° C. in a nitrogen atmosphere, so as to yield ITO powder (conductive particles).

Example 1

A rectangular film of polyethylene terephthalate (PET) having a size of 10 cm×30 cm (as a support with a thickness of 100 μm; manufactured by Teijin Ltd.) was attached to a glass substrate with a double-sided adhesive tape, so as to secure the support made of the PET film onto the glass substrate.

Then, 36 parts by mass of polyethylene glycol diacrylate (monomer; product name: A-600 manufactured by Shin-Nakamura Chemical Co., Ltd.), 12 parts by mass of 2-hydroxy-3-phenoxypropyl acrylate (monomer; product name: 702A manufactured by Shin-Nakamura Chemical Co., Ltd.), and 1 part by mass of a radical polymerization initiator (ESACURE KTO46 manufactured by Lamberti S.p.A.) were mixed in 50 parts by mass of methylethylketone (MEK manufactured by Kanto Chemical Co., Inc.), so as to yield a first mixed liquid.

The first mixed liquid was applied by bar coating onto the support such as to yield a thickness of 10 μm after polymerization, and was polymerized upon UV irradiation with an integrated illuminance of 1,000 mJ/cm² by using a high-pressure mercury lamp as a light source, so as to yield a binder layer.

Next, 150 parts by mass of thus obtained ITO powder (having an average particle size of 30 nm), 20 parts by mass of ethoxylated bisphenol A diacrylate (monomer; product name: A-BPE-20 manufactured by Shin-Nakamura Chemical Co., Ltd.), 35 parts by mass of polyethylene glycol dimethacrylate (monomer; product name: 14G manufactured by Shin-Nakamura Chemical Co., Ltd.), 25 parts by mass of 2-hydroxy-3-phenoxypropyl acrylate (monomer; product name: 702A manufactured by Shin-Nakamura Chemical Co., Ltd.), 10 parts by mass of a urethane-modified acrylate (monomer; product name: UA-512 manufactured by Shin-Nakamura Chemical Co., Ltd.), 10 parts by mass of an acrylic polymer (with an average molecular weight of about 50,000, having 50 acryloyl groups and 25 triethoxysilane groups on average per molecule), 1 part by mass of TINUVIN 123 (hindered-amine-based radical scavenger manufactured by Ciba Specialty Chemicals), and 2 parts by mass of a radical polymerization initiator (ESACURE KTO46 manufactured by Lamberti S.p.A.) were mixed in 50 parts by mass of methylethylketone (MEK manufactured by Kanto Chemical Co., Inc.), so as to yield a second mixed liquid (transparent conductive material).

The second mixed liquid was applied by bar coating onto the binder layer such as to yield a thickness of 50 μm after polymerization, and was polymerized upon UV irradiation with an integrated illuminance of 3,000 mJ/cm² by using a high-pressure mercury lamp as a light source, so as to form a conductive layer. Then, the glass substrate was separated from the support, so as to yield a transparent conductor A.

Example 2

A transparent conductor B was obtained as in Example 1 except that 1 part by mass of TINUVIN 900 (benzotriazole-based UV-absorbing agent manufactured by Ciba Specialty Chemicals) was further contained in the first mixed liquid used in Example 1.

Example 3

A transparent conductor C was obtained as in Example 1 except that 1 part by mass of 2-(dimethylamino)ethyl benzoate (amine-based photosensitizer manufactured by Lamberti S.p.A.) was further contained in the second mixed liquid in Example 1.

Example 4

A transparent conductor D was obtained as in Example 1 except that antimony-doped tin oxide was employed in place of the ITO powder used in Example 1.

Example 5

A transparent conductor E was obtained as in Example 2 except that antimony-doped tin oxide was employed in place of the ITO powder used in Example 2.

Example 6

A transparent conductor F was obtained as in Example 3 except that antimony-doped tin oxide was employed in place of the ITO powder used in Example 3.

Example 7

A transparent conductor G was obtained as in Example 1 except that gallium-doped zinc oxide was employed in place of the ITO powder used in Example 1.

Example 8

A transparent conductor H was obtained as in Example 2 except that gallium-doped zinc oxide was employed in place of the ITO powder used in Example 2.

Example 9

A transparent conductor I was obtained as in Example 3 except that gallium-doped zinc oxide was employed in place of the ITO powder used in Example 3.

Comparative Example 1

A transparent conductor J was obtained as in Example 1 except that TINUVIN 123 employed for preparing the second mixed liquid in Example 1 was not used.

Evaluation Method

First, using the transparent conductors A to C and J obtained by Examples 1 to 3 and Comparative Example 1, whether a radical polymerization initiator and a radical scavenger existed or not was investigated.

Outgas Test

The transparent conductors of Examples 1 to 3 and Comparative Example 1 were analyzed by HS-GC-MS (Head-Space/Gas Chromatography/Mass Spectrometry) in terms of outgases from the transparent conductors A to C and J, so as to investigate whether there were radical polymerization initiators or not. As a result, a radical polymerization initiator and its decomposed product, acetone, were detected in each of the transparent conductors. This verified that the radical polymerization initiator remained in each of the transparent conductors.

Ratio of Change in Electric Resistance Value

In the following manner, electric resistance was evaluated in the transparent conductors A to C and J obtained in Examples 1 to 3 and Comparative Example 1. Namely, thus obtained transparent conductors A to C and J were each cut into a 50-mm square, electrodes were formed by a width of 5 mm each from a given pair of opposing end faces on the surface of its conductive layer by a conductive paste made of silver, and a digital multimeter (PC5000 manufactured by Sanwa Electric Instrument Co., Ltd.) was connected between the electrodes. They were arranged in a darkroom at room temperature with a low humidity (2% RH or less) such that the surface of the transparent conductor on the support side opposes a light source, and were irradiated with near-UV rays having a peak wavelength of 352 nm from a black light (catalog number: FL6BLB manufactured by Toshiba Lighting & Technology Corporation) placed at a position vertically distanced by 20 cm from the surface on the support side. Using the electric resistance value before the near-UV irradiation as an initial resistance value, and the electric resistance value after 1-hr irradiation as an afterload resistance value, the ratio of change was calculated according to the following expression:

Ratio of change=afterload resistance value/initial resistance value.

Table 1 shows thus obtained results.

TABLE 1

| | INITIAL RESISTANCE VALUE kΩ/□ | AFTERLOAD RESISTANCE VALUE kΩ/□ | RATIO OF CHANGE |
|---|---|---|---|
| EXAMPLE 1 | 3.66 | 3.48 | 0.95 |
| EXAMPLE 2 | 3.24 | 3.18 | 0.98 |
| EXAMPLE 3 | 3.71 | 3.60 | 0.97 |
| COMPARATIVE EXAMPLE 1 | 3.49 | 2.76 | 0.79 |

Electron Spin Resonance Analysis Measurement

An electron spin resonance analysis was performed, so as to verify whether there was a radical scavenger or not. First, in each of the above-mentioned Examples 1 to 3 and Comparative Example 1, only the support made of the PET film was replaced by a silica glass substrate, so as to prepare a transparent conductor of 3 mm×17 mm. Then, using an electron spin resonance analyzer (ESP350E manufactured by Bruker), an electron spin resonance analysis was performed while UV rays (from an ultrahigh-pressure mercury lamp manufactured by Ushio Inc.) were continuously emitted at 20 K. The irradiance at that time was about 20 mW/cm$^2$ at 365 nm. As a result of the measurement, a broad signal caused by a radical on carbon was observed near g=2.000 to 2.003 in all of the transparent conductors, while a narrow signal assumed to be caused by ITO was observed near g=1.998 to 1.999 only in the transparent conductor of Comparative Example 1.

This verified that, upon the UV irradiation, radicals were captured sufficiently in the transparent conductors of Examples 1 to 3, but not sufficiently in the transparent conductor of Comparative Example 1. Therefore, it was proved that radical scavengers existed in the transparent conductors of Examples 1 to 3, but not in the transparent conductor of Comparative Example 1.

As Table 1 clearly shows, the transparent conductors A to C of Examples 1 to 3 were found to yield smaller ratios of change in electric resistance value and be able to suppress the change in electric resistance value more sufficiently than the transparent conductor J of Comparative Example 1. When evaluated in terms of outgas test, ratio of change in electric resistance, and electron spin resonance analysis as in Examples 1 to 3, the transparent conductors of Examples 4 to 9 yielded results similar to those of Examples 1 to 3. As a consequence, it is deemed that a radical scavenger contained in the transparent conductors can suppress the change in electric resistance value in Examples 4 to 9 as well.

It has also been clarified that a UV-absorbing agent can more strongly suppress the change in electric resistance value from the results of Examples 1 and 2, and that an amine-based sensitizer can more strongly suppress the change in electric resistance value from the results of Examples 1 and 3.

The foregoing results have verified that the transparent conductive material and transparent conductor in accordance with the present invention can sufficiently restrain the electric resistance value from changing.

What is claimed is:

1. A transparent conductor comprising a conductive layer containing conductive particles, a binder, a polymerization initiator, and a radical scavenger, the content of the polymerization initiator being 0.2 to 2.0 mass % when the total mass of the conductive layer is 100 mass %, and the content of the radical scavenger being 0.1 to 1.0 mass % when the total mass of the conductive layer is 100 mass %, 0.1 to 5.0 mass % of a UV-absorbing agent, 0.2 to 2.0 mass % of a photosensitizer, 10 to 70 volume % of the conductive particles having a specific surface area of 10 to 50 m²/g.

2. A transparent conductor according to claim 1, wherein the radical scavenger is represented by the following general formula (1):

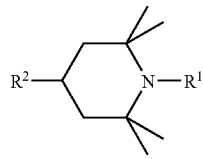

where $R^1$ is a hydrogen atom, an alkyl group which may have a substituent, an alkoxy group which may have a substituent, or an alkylene oxide group which may have a substituent, whereas $R^2$ is a hydrogen atom, an alkyl group which may have a substituent, an alkoxy group which may have a substituent, a carboxyl group, a hydroxyl group, an amine group which may have a substituent, or an alkylene oxide group which may have a substituent.

3. A transparent conductor according to claim 2, wherein $R^2$ is one of an alkyl group, an alkoxy group, and an alkylene oxide group.

4. A transparent conductive material containing a monomer for forming a binder, conductive particles, a polymerization initiator, and a radical scavenger, the content of the polymerization initiator being 0.2 to 2.0 mass % when the total mass of the conductive material is 100 mass %, and the content of the radical scavenger being 0.1 to 1.0 mass % when the total mass of the conductive material is 100 mass %, 0.1 to 5.0 mass % of a UV absorbing agent, 0.2 to 2.0 mass % of a photosensitizer, 10 to 70 volume % of the conductive particles having a specific surface area of 10 to 50 m²/g.

* * * * *